United States Patent
Takahashi

(10) Patent No.: US 8,426,038 B2
(45) Date of Patent: Apr. 23, 2013

(54) PHOSPHORESCENT POLYMER COMPOUND AND ORGANIC ELECTROLUMINESCENCE DEVICE USING THE SAME

(75) Inventor: Yoshiaki Takahashi, Chiba (JP)

(73) Assignee: Showa Denko K.K., Tokyo (JP)

( * ) Notice: Subject to any disclaimer, the term of this patent is extended or adjusted under 35 U.S.C. 154(b) by 498 days.

(21) Appl. No.: 12/678,081

(22) PCT Filed: Sep. 10, 2008

(86) PCT No.: PCT/JP2008/066303
§ 371 (c)(1),
(2), (4) Date: Mar. 12, 2010

(87) PCT Pub. No.: WO2009/034987
PCT Pub. Date: Mar. 19, 2009

(65) Prior Publication Data
US 2010/0252822 A1    Oct. 7, 2010

(30) Foreign Application Priority Data
Sep. 14, 2007   (JP) ................ 2007-239792

(51) Int. Cl.
*H01L 51/54*  (2006.01)
*C09K 11/06*  (2006.01)

(52) U.S. Cl.
USPC .... 428/690; 428/917; 313/504; 257/E51.033; 257/E51.036; 257/E51.044; 526/241; 526/259

(58) Field of Classification Search .................. None
See application file for complete search history.

(56) References Cited

U.S. PATENT DOCUMENTS

| | | | |
|---|---|---|---|
| 7,872,411 B2 | 1/2011 | Yamaguchi et al. | |
| 2001/0019782 A1 * | 9/2001 | Igarashi et al. | 428/690 |
| 2003/0068526 A1 * | 4/2003 | Kamatani et al. | 428/690 |
| 2003/0072964 A1 | 4/2003 | Kwong et al. | |
| 2003/0091862 A1 | 5/2003 | Tokito et al. | |
| 2003/0186080 A1 * | 10/2003 | Kamatani et al. | 428/690 |
| 2004/0247934 A1 * | 12/2004 | Takeuchi et al. | 428/690 |
| 2007/0167588 A1 | 7/2007 | Kato et al. | |
| 2008/0050604 A1 | 2/2008 | Takahashi et al. | |
| 2009/0096353 A1 | 4/2009 | Takahashi et al. | |

FOREIGN PATENT DOCUMENTS

| | | |
|---|---|---|
| JP | 08157575 A | 6/1996 |
| JP | 10001665 A | 1/1998 |
| JP | 2003-073387 A | 3/2003 |
| JP | 2004531850 A | 10/2004 |
| JP | 2005-506361 A | 3/2005 |
| JP | 2006-008996 A | 1/2006 |
| JP | 2006-278781 A | 10/2006 |
| JP | 2006-278782 A | 10/2006 |
| JP | 2007-023269 A | 2/2007 |
| WO | 0231896 A2 | 4/2002 |
| WO | 03/018653 A1 | 3/2003 |
| WO | WO 2006001150 A1 | 1/2006 |
| WO | WO 2006135076 A1 | 12/2006 |
| WO | WO 2007020881 A1 | 2/2007 |

OTHER PUBLICATIONS

Richard J. Gobeil, et al., "Derivatives of Benzo(h)quinoline", Journal of the American Chemical Society, Apr. 1945, vol. 67, pp. 511-513.

* cited by examiner

*Primary Examiner* — Marie R. Yamnitzky
(74) *Attorney, Agent, or Firm* — Sughrue Mion, PLLC

(57) ABSTRACT

Organic electroluminescence devices including phosphorescent polymer compounds having high light-emitting efficiency and long luminescent life. These phosphorescent polymer compounds include a structural unit that is derived from a compound of Formula (1) below as a side-chain thereof. In Formula (1), L1 and L2 are two different kinds of ligands, and are selected from Formulae (a1) to (a6) and (b1) to (b6), respectively, as defined in the specification.

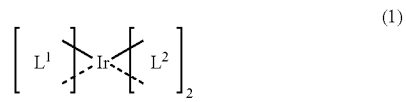

(1)

8 Claims, 1 Drawing Sheet

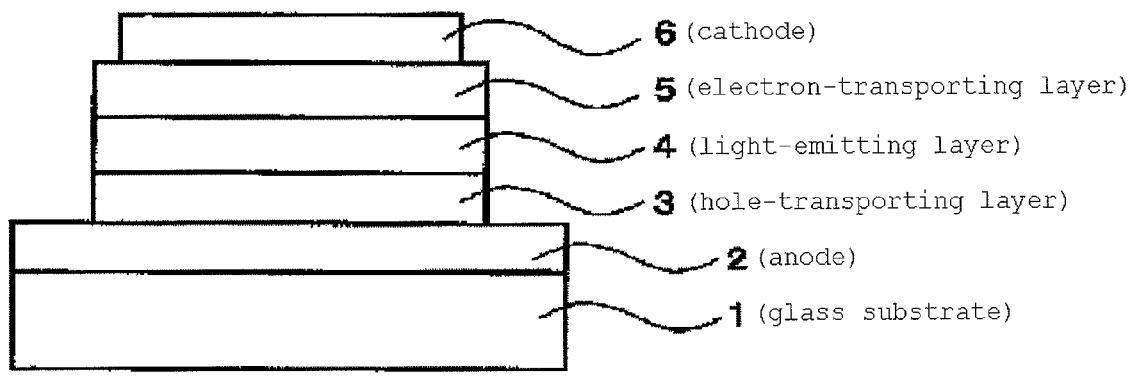

PHOSPHORESCENT POLYMER COMPOUND AND ORGANIC ELECTROLUMINESCENCE DEVICE USING THE SAME

FIELD OF THE INVENTION

The present invention relates to phosphorescent polymer compounds. In more detail, the invention relates to phosphorescent polymer compounds suited as light-emitting materials in organic electroluminescence devices, and to organic electroluminescence devices using the compounds.

BACKGROUND OF THE INVENTION

Materials containing phosphorescent compounds with high light-emitting efficiency have been developed actively to expand the applications of organic electroluminescence devices (hereinafter, also the organic EL devices). In order to broaden the use of the organic EL devices to full-color displays or illumination in particular, it is necessary that blue or green luminescent materials having high light-emitting efficiency should be developed and that red or yellow luminescent materials which enable stable and sustainable drive of the organic EL devices should be developed.

A number of iridium complexes in which a ligand has a condensed ring are known as red or yellow phosphorescent materials. In particular, iridium complexes with a quinoline or isoquinoline structure are promising luminescent materials because the organic EL devices having the complexes show very high light-emitting efficiency. Patent Document 1 discloses a luminescent polymer material that has a phosphorescent iridium complex as a side chain of the polymer. In the luminescent polymer material, a ligand not involved in light emission and bonded to the polymer main chain, such as β-diketonate, is coordinated to the iridium, and 2-aryl-quinoline is also coordinated to the iridium. The luminescence from the iridium complex that is a light-emitting site in the polymer material is probably attributed to electron transition between the metal and the aryl-quinoline ligand or within the aryl-quinoline ligand.

Patent Document 2 discloses a luminescent polymer material having a tris(phenylquinoline)iridium complex structure in a side chain. The luminescent polymer material emits a red-orange color. The luminescence is probably attributed to electron transition between the metal and the phenylquinoline ligand or within the phenylquinoline ligand, and all the three phenylquinoline ligands possibly participate in the light emission. Patent Document 2 further discloses a luminescent polymer material having a structure in which phenylpyridine bonded to the polymer main chain is coordinated to iridium and two phenylquinoline ligands are also coordinated to the iridium. This luminescent material emits a red-orange light, and the luminescence is probably attributed to the two phenylquinoline ligands distant from the polymer main chain.

However, organic EL devices manufactured with the luminescent materials disclosed in Patent Documents 1 and 2 are still insufficient in light-emitting efficiency and durability.
Patent Document 1: JP-A-2004-531850
Patent Document 2: JP-A-2007-23269

SUMMARY OF THE INVENTION

It is an object of the invention to provide organic electroluminescence devices having high light-emitting efficiency and long life.

The present inventors studied diligently to solve the problems as described above. They have supposed that the lowering in light-emitting efficiency or life of organic EL devices having the luminescent polymer materials is ascribed to the facts that the iridium complex structure which is a light-emitting site of the luminescent polymer material has a large number of ligands involved in the light emission, that the ligands involved in the light emission have so high a freedom with respect to the polymer main chain that the ligands easily form excimers with other light-emitting sites or charge transporters, and that the ligands involved in the light emission are physically close to quenchers generated by the driving of the device. The present inventors have then found that the light-emitting efficiency and life of organic EL devices are increased by limiting the luminescent ligand to one ligand in an iridium complex structure which ligand is bonded to a main chain of a polymer compound and by coordinating a non-luminescent ligand containing no heteroatoms. The present invention has been completed based on the findings.

The present invention is concerned with the following [1] to [8].

[1] A phosphorescent polymer compound comprising a structural unit that is derived from a compound of Formula (1):

[Chem. 1]

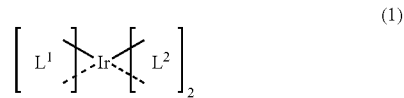

(1)

wherein $L^1$ is a ligand selected from Formulae (a1) to (a6) below and $L^2$ is a ligand selected from Formulae (b1) to (b6) below:

[Chem. 2]

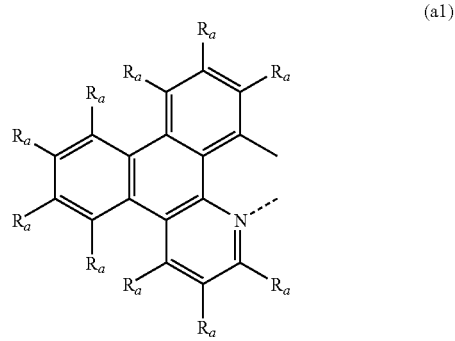

(a1)

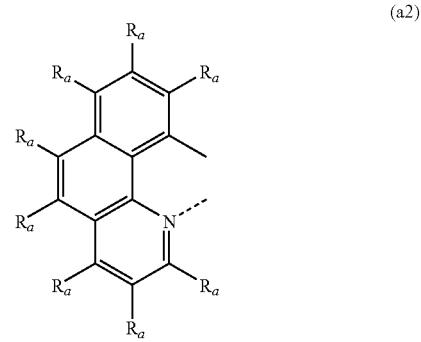

(a2)

-continued
(a3)
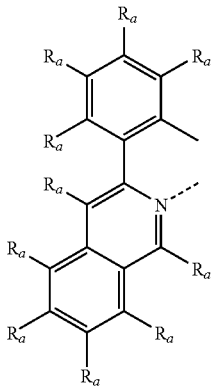
(a4)
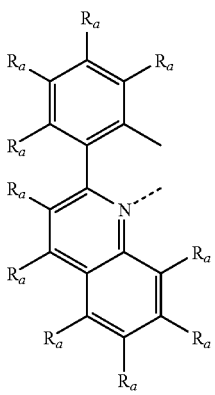
(a5)
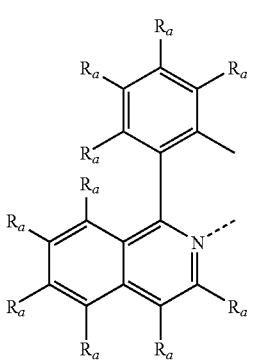
(a6)
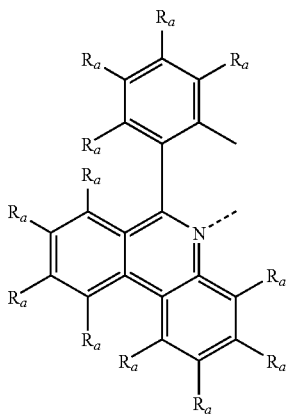
wherein a plurality of $R_a$ in each of Formulae (a1) to (a6) are each independently a hydrogen atom, a C1-10 alkyl group or a C1-5 alkyl or alkenyl group having a polymerizable functional group; and
one of the plurality of $R_a$ in each of Formulae (a1) to (a6) is a C1-5 alkyl or alkenyl group having a polymerizable functional group;
[Chem. 3]
(b1)
(b2)
(b3)
(b4)

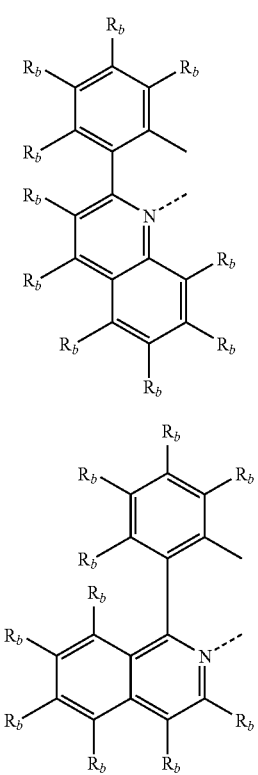

(b5)

(b6)

wherein a plurality of $R_b$ in each of Formulae (b1) to (b6) are each independently a hydrogen atom or a C1-10 alkyl group;

and wherein $L^1$ and $L^2$ are selected such that $E^1$ and $E^2$ described below satisfy the relation $E^1 < E^2$;

$E^1$ is a frequency (cm$^{-1}$) of light showing a maximum luminescence intensity in a luminescence spectrum obtained by exciting a solution of an iridium complex of Formula (2) below [in dichloromethane at 25° C., the solution being prepared such that the absorbance for 350 nm monochromatic light with alight path length of 1 cm is 0.1] with 350 nm monochromic light:

[Chem. 4]

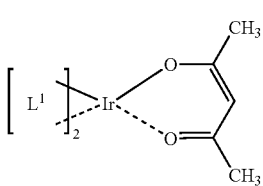

(2)

Wherein $L^1$ is a ligand selected from Formulae (a1) to (a6) as $L^1$ is defined in Formula (1), in which $R_a$ are all hydrogen atoms;

$E^2$ is a frequency (cm$^{-1}$) of light showing a maximum luminescence intensity in a luminescence spectrum obtained by exciting a solution of an iridium complex of Formula (3) below [in dichloromethane at 25° C., the solution being prepared such that the absorbance for 350 nm monochromatic light with alight path length of 1 cm is 0.1] with 350 nm monochromic light:

[Chem. 5]

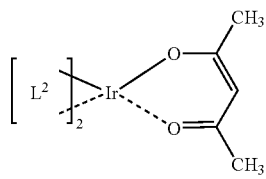

(3)

Wherein $L^2$ is a ligand selected from Formulae (b1) to (b6) as $L^2$ is defined in Formula (1), in which $R_b$ are all hydrogen atoms.

[2] The phosphorescent polymer compound described in claim 1, wherein the polymer compound is obtained by radical polymerization and the main chain skeleton of the polymer compound is a saturated carbon chain skeleton.

[3] The phosphorescent polymer compound described in [1] above, wherein the difference between $E_1$ and $E_2$ is not less than 1000 cm$^{-1}$.

[4] The phosphorescent polymer compound described in [1] above, wherein the phosphorescent polymer compound further comprises a structural unit derived from at least one of hole-transporting polymerizable compounds and electron-transporting polymerizable compounds.

[5] A process for manufacturing organic electroluminescence devices, comprising a step of forming on an anode at least one organic compound layer comprising the phosphorescent polymer compound described in any one of [1] to [4] above, and a step of forming a cathode on the organic compound layer.

[6] An organic electroluminescence device wherein the device comprises a pair of electrodes and at least one organic compound layer including a light-emitting layer between the electrodes, and the light-emitting layer comprises the phosphorescent polymer compound described in any one of [1] to [4] above.

[7] An organic electroluminescence device manufactured by the process described in [5] above.

[8] A display device comprising the organic electroluminescence device described in [6] or [7] above.

Advantageous Effects of the Invention

The organic EL devices manufactured with the phosphorescent polymer compounds of the present invention have excellent light-emitting efficiency and long life.

BRIEF DESCRIPTION OF THE DRAWING

FIG. 1 is a cross-sectional view of an organic EL device according to an embodiment of the invention.

| DESCRIPTION OF NUMERALS | |
|---|---|
| 1: | glass substrate |
| 2: | anode |
| 3: | hole-transporting layer |
| 4: | light-emitting layer |
| 5: | electron-transporting layer |
| 6: | cathode |

PREFERRED EMBODIMENTS FOR CARRYING OUT THE INVENTION

The present invention will be described in detail hereinbelow.

Phosphorescent Polymer Compounds

<Phosphorescent Site>

The phosphorescent polymer compounds of the invention have a structural unit derived from a phosphorescent compound (an iridium complex) of Formula (1) below as a phosphorescent site.

[Chem. 6]

(1)

In Formula (1), $L^1$ is a ligand selected from Formulae (a1) to (a6) below and $L^2$ is a ligand selected from Formulae (b1) to (b6) below.

[Chem. 7]

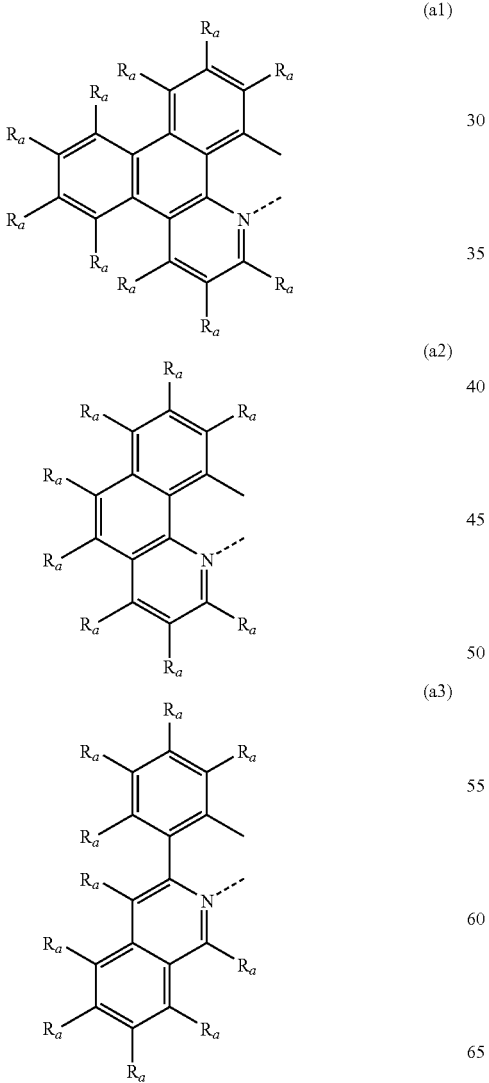

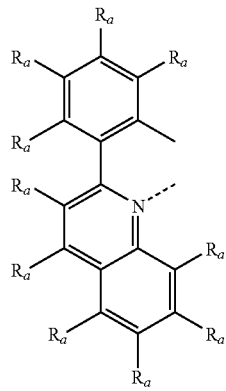

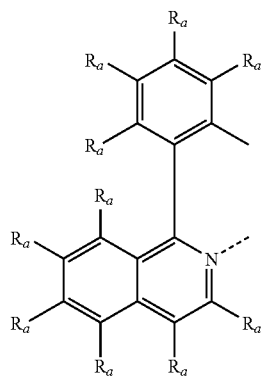

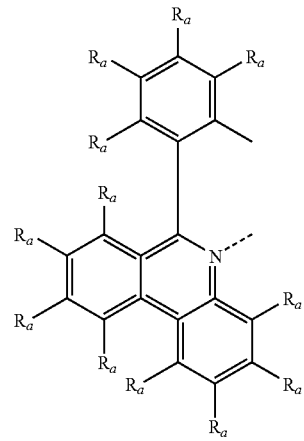

In each of Formulae (a1) to (a6), a plurality of $R_a$ are each independently a hydrogen atom, a C1-10 alkyl group or a C1-5 alkyl or alkenyl group having a polymerizable functional group. In each of Formulae (a1) to (a6), one of the plurality of $R_a$ is a C1-5 alkyl or alkenyl group having a polymerizable functional group.

[Chem. 8]

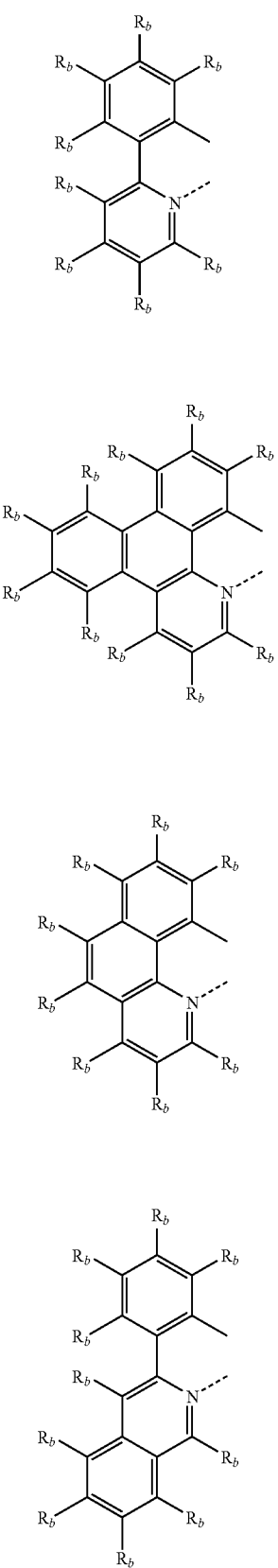

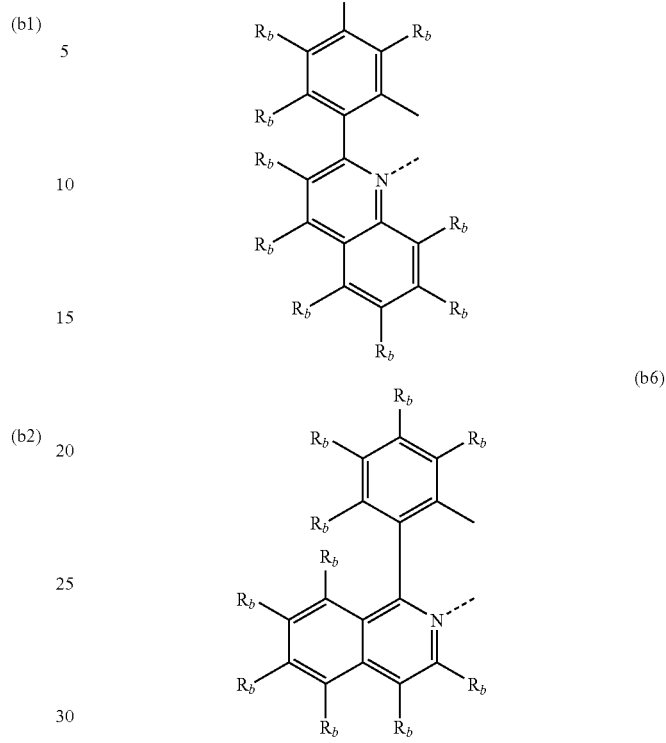

In each of Formulae (b1) to (b6), a plurality of $R_b$ are each independently a hydrogen atom or a C1-10 alkyl group.

The compounds represented by Formula (1) are iridium complexes having two different kinds of ligands, namely, one ligand $L^1$ and two ligands $L^2$. The ligand $L^1$ is selected from the ligands represented by Formulae (a1) to (a6), and the ligands $L^2$ are selected from the ligands represented by Formulae (b1) to (b6). The ligand $L^1$ has a quinoline or isoquinoline skeleton in its ligand structure, and consequently the iridium complex emits visible light of relatively long wavelength such as red light or yellow light.

Referring to $L^1$, when the plurality of $R_a$ in any of Formulae (a1) to (a6) are all hydrogen atoms, the ligand $L^1$ represented by such Formula (a1), (a2), (a3), (a4), (a5) or (a6) gives a frequency $E^1$ (cm$^{-1}$) of 18692 cm$^{-1}$, 18248 cm$^{-1}$, 16807 cm$^{-1}$, 16750 cm$^{-1}$, 16077 cm$^{-1}$ or 15175 cm$^{-1}$, respectively, wherein the frequency is that of light showing a maximum luminescence intensity in a luminescence spectrum obtained by exciting a solution of an iridium complex of Formula (2) below [in dichloromethane at 25° C., the solution being prepared such that the absorbance for 350 nm monochromatic light with a light path length of 1 cm is 0.1] with 350 nm monochromic light.

[Chem. 9]

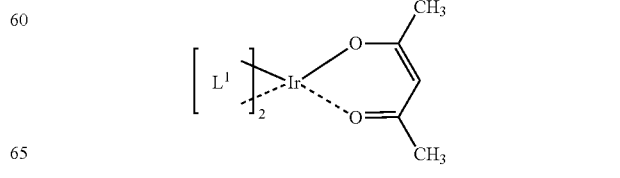

Referring to $L^2$, when the plurality of $R_b$ in any of Formulae (b1) to (b6) are all hydrogen atoms, the ligand $L^2$ represented by such Formula (b1), (b2), (b3), (b4), (b5) or (b6) gives a frequency $E^2$ (cm$^{-1}$) of 19493 cm$^{-1}$, 18692 cm$^{-1}$, 18248 cm$^{-1}$, 16807 cm$^{-1}$, 16750 cm$^{-1}$ or 16077 cm$^{-1}$, respectively, wherein the frequency is that of light showing a maximum luminescence intensity in a luminescence spectrum obtained by exciting a solution of an iridium complex of Formula (3) below [in dichloromethane at 25° C., the solution being prepared such that the absorbance for 350 nm monochromatic light with a light path length of 1 cm is 0.1] with 350 nm monochromic light.

[Chem. 10]

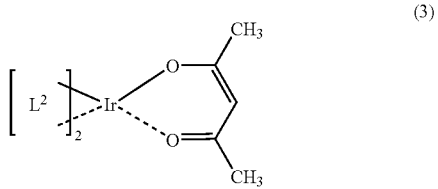

(3)

Here, the absorbances and the luminescence spectra of the iridium complex solutions may be obtained with a usual UV-visible absorption spectrophotometer or fluorescence spectrophotometer. In the invention, UV-visible absorption spectrophotometer UV-2400 PC manufactured by Shimadzu Corporation and fluorescence spectrophotometer FP6500 manufactured by JASCO Corporation are used. The frequency (unit: cm$^{-1}$) of light showing a maximum luminescence intensity in a luminescence spectrum of the iridium complex solution is not dependent on the concentration of the iridium complex as long as the solution is a dilute solution. As an index of the concentration, the absorbance for 350 nm monochromatic light with a light path length of 1 cm is 0.1. The solution may be, however, regarded to be dilute when the absorbance is not more than 2.

The ligands $L^1$ and $L^2$ are selected such that $E^1$ and $E^2$ described above satisfy the relation $E^1<E^2$. When $E^1$ and $E^2$ have this relation, the phosphorescent polymer compound that includes a structural unit derived from the iridium complex of Formula (1) emits light of substantially identical color with the light from a solution of the iridium complex of Formula (2) above [in dichloromethane at 25° C., the solution being prepared such that the absorbance for 350 nm monochromatic light with a light path length of 1 cm is 0.1]. In detail, the luminescence of the phosphorescent polymer compound is brought about by the ligand $L^1$ alone without any involvement of the ligand $L^2$. In other words, it is considered that only the ligand $L^1$ emits light and the ligand $L^2$ does not play a role in the light emission.

In the phosphorescent polymer compounds containing a structural unit from the iridium complex of Formula (1), the ligand involved in the light emission is limited to one ligand ($L^1$) in the iridium complex structure that is bonded to the main chain of the phosphorescent polymer compound. It is probably because of this limitation that the organic EL devices of the invention manufactured with the compounds of Formula (1) achieve higher light-emitting efficiency and longer life compared to the conventional organic EL devices.

When the difference between $E^1$ and $E^2$ is 1000 cm$^{-1}$ or more, the luminescent ligands in the phosphorescent polymer compounds containing a structural unit from the iridium complex of Formula (1) are substantially completely limited to the ligands $L^1$. As a result, the light-emitting efficiency and life of the organic EL devices will be further increased.

Referring to the phosphorescent polymer compounds containing a structural unit from the iridium complex of Formula (1), the aromatic rings in the ligands $L^1$ and $L^2$ do not contain any heteroatoms except the nitrogen atom directly coordinated to the metal. The absence of heteroatoms removes factors that lower the light-emitting efficiency, such as the electron abstraction from lone electron pairs present in the iridium complex, and the interaction with positively charged quenchers such as metal ions. This feature is probably one reason for that the organic EL devices that are manufactured with the phosphorescent polymer compounds containing a structural unit from the iridium complex of Formula (1) achieve a longer life than the conventional organic EL devices.

When Formula (1) is expressed as, for example:

[Chem. 11]

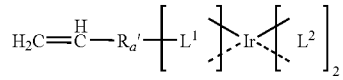

a structural unit derived from the above iridium complex may be represented by:

[Chem. 12]

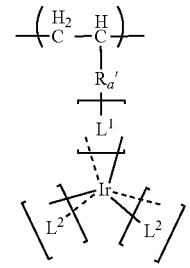

[$R_a$]

In each of Formulae (a1) to (a6) described hereinabove, $R_a$ independently at each occurrence is a hydrogen atom, a C1-10 alkyl group or a C1-5 alkyl or alkenyl group having a polymerizable functional group. The kinds of these substituent groups do not greatly affect the luminescent color of the phosphorescent polymer compounds of the invention. For example, radical polymers of iridium complexes (1A) to (1D) illustrated below by formulae corresponding to Formula (1) in which $L^1$ is a ligand represented by Formula (a4) and $L^2$ is a ligand represented by Formula (b1) emit light which is plotted on the x and y coordinates (x, y) of (0.61±0.01, 0.39±0.01) according to the XYZ color system by the international commission on illumination (CIE) [as measured in a solution in dichloromethane at 25° C., the solution being prepared such that the absorbance for 350 nm monochromatic light with a light path length of 1 cm is 0.1]. In more detail, all of these polymers emit a substantially identical orange color. As already described, this luminescent color is substantially identical with the color of light emitted from a solution of the iridium complex of Formula (2) in which $L^1$ is a ligand of Formula (a4) [in dichloromethane at 25° C., the solution being prepared such that the absorbance for 350 nm monochromatic light with a light path length of 1 cm is 0.1]. In other words, the phosphorescent polymer compounds containing a structural unit from the iridium complexes (1A) to (1D) produce a luminescent color substantially identical with the color from a solution of the iridium complex of Formula (2) in which $L^1$ is a ligand of Formula (a4) [as measured in a solution in dichloromethane at 25° C., the solution being prepared such that the absorbance for 350 nm monochromatic light with a light path length of 1 cm is 0.1].

[Chem. 13]

(1A)
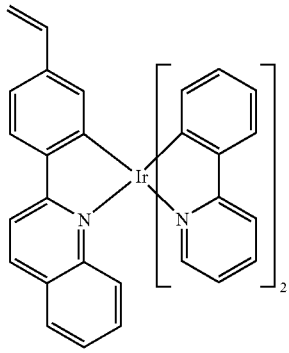

(1B)
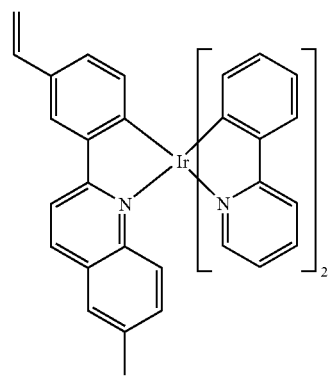

(1C)
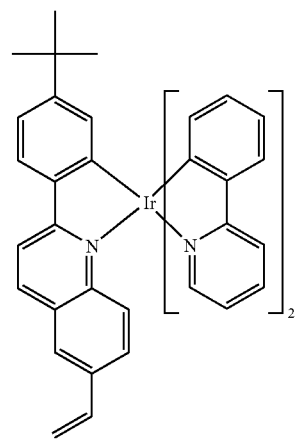

(1D)
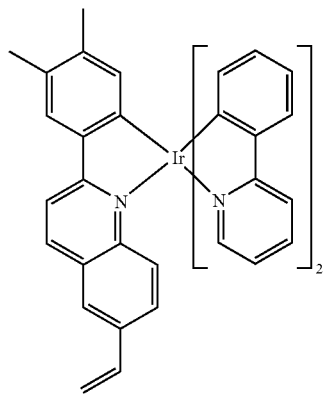

Examples of the C1-10 alkyl groups include methyl group, ethyl group, propyl group, isopropyl group, butyl group, isobutyl group, t-butyl group, amyl group, hexyl group, cyclohexyl group, octyl group and decyl group.

In each of Formulae (a1) to (a6), one of the plurality of $R_a$ is a C1-5 alkyl or alkenyl group having a polymerizable functional group.

The polymerizable functional groups may be radically polymerizable, cationically polymerizable, anionically polymerizable, addition polymerizable or condensation polymerizable functional groups. Of these, radically polymerizable functional groups are preferable because the polymer production is easy.

Examples of the polymerizable functional groups include alkenyl groups (such as vinyl group, isopropenyl group and allyl group), styryl group, acryloyloxy group, methacryloyloxy group, urethane(meth)acryloyloxy groups such as methacryloyloxyethyl carbamate group, vinylamide groups, and derivatives of these groups. Of these, the vinyl group, the styryl group and the methacryloyloxy group are preferred.

The C1-5 alkyl groups having these polymerizable functional groups include alkyl group derivatives in which a hydrogen atom in alkyl groups such as methyl group, ethyl group, propyl group, isopropyl group, butyl group and pentyl group is substituted by the above polymerizable functional group. A heteroatom-containing divalent group (a spacer) such as —O— and —O—CH$_2$— may be inserted between the alkyl group and the polymerizable functional group.

Typical examples of the C1-5 alkyl or alkenyl groups having the polymerizable functional group are represented by Formulae (c1) to (c8) below.

[Chem. 14]

 (c1)

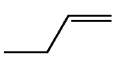 (c2)

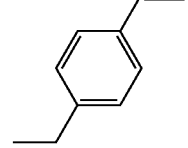 (c3)

-continued

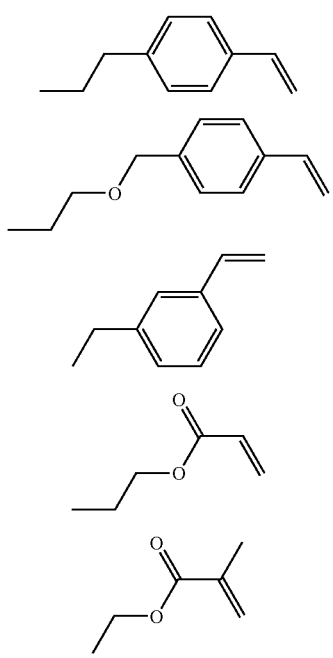

(c4)

(c5)

(c6)

(c7)

(c8)

In a preferred embodiment, $R_a$ independently at each occurrence is a hydrogen atom, a methyl group or a t-butyl group. In view of easy synthesis of the compounds, the substituent groups $R_a$ in Formulae (a1) to (a6) other than the substituent group that represents the C1-5 alkyl or alkenyl group having the polymerizable functional group are preferably hydrogen atoms.

[$R_b$]

In each of Formulae (b1) to (b6) described hereinabove, $R_b$ independently at each occurrence is a hydrogen atom or a C1-10 alkyl group. The kinds of these substituent groups do not greatly affect the luminescent color of the phosphorescent polymer compounds of the invention. Examples of the C1-10 alkyl groups include methyl group, ethyl group, propyl group, isopropyl group, butyl group, isobutyl group, t-butyl group, amyl group, hexyl group, cyclohexyl group, octyl group and decyl group. Of these, the hydrogen atom, the methyl group and the t-butyl group are preferable.

From the viewpoints of efficiency and life of the organic EL devices, the ligands of Formulae (b1) to (b6) are particularly preferably represented by Formulae (b1') to (b6') below, respectively.

[Chem. 15]

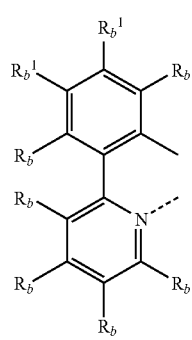

(b1')

-continued

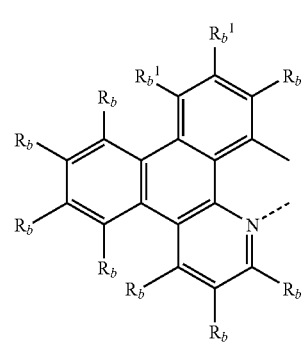

(b2')

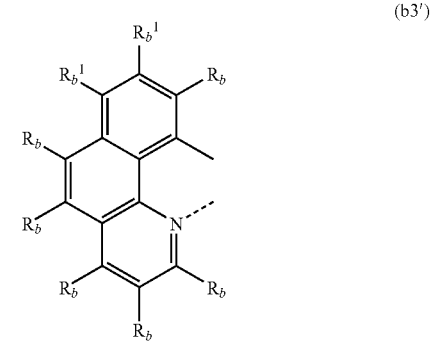

(b3')

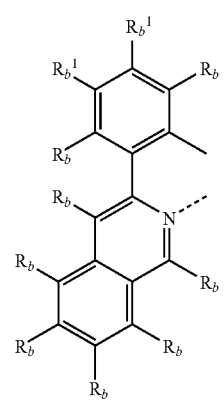

(b4')

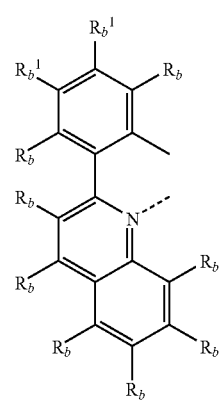

(b5')

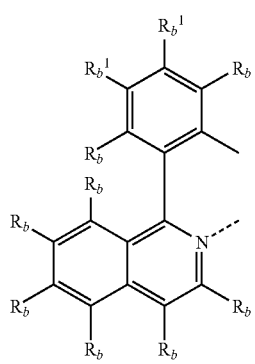

(b6')

In each of Formulae (b1') to (b6'), $R_b^1$ independently at each occurrence is a methyl group, a t-butyl group or a hydrogen atom, and at least one $R_b^1$ is a methyl group or a t-butyl group.

[Processes for Producing Iridium Complexes of Formula (1)]

The iridium complexes represented by Formula (1) may be produced by known processes, for example by a process including the following steps (i) and (ii):

Step (i):

A ligand ($L^2$-H) which will form the ligand $L^2$ in the iridium complex of Formula (1) and in which the substituent groups on the carbon atom that will be bonded to the iridium atom are hydrogen atoms, is reacted with iridium chloride trihydrate ($IrCl_3(H_2O)_3$) to give a compound represented by Formula (α) below.

Step (ii):

The compound of Formula (α) is reacted with a ligand ($L^1$-H) which will form the ligand $L^1$ in the iridium complex of Formula (1) and in which the substituent groups on the carbon atom that will be bonded to the iridium atom are hydrogen atoms, in the presence of silver trifluoromethanesulfonate to produce the iridium complex represented by Formula (1).

[Chem. 16]

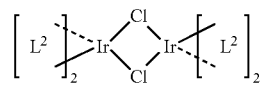

(α)

In Formula (α), $L^2$ has the same definition as $L^2$ in Formula (1).

(Charge-Transporting Units)

The phosphorescent polymer compounds of the invention may further contain a structural unit derived from at least one of hole-transporting polymerizable compounds and electron-transporting polymerizable compounds. In the invention, the hole-transporting polymerizable compounds and the electron-transporting polymerizable compounds will be collectively referred to as the charge-transporting polymerizable compounds.

In a preferred embodiment, the phosphorescent polymer compound contains a structural unit derived from one, two or more kinds of hole-transporting polymerizable compounds or a structural unit derived from one, two or more kinds of electron-transporting polymerizable compounds. Such polymer compounds can form a uniform light emitting layer by a coating technique which has high electric charge mobility and high luminance efficiency.

More preferably, the phosphorescent polymer compound contains a structural unit derived from one, two or more kinds of hole-transporting polymerizable compounds and a structural unit derived from one, two or more kinds of electron-transporting polymerizable compounds. Since such phosphorescent polymer compound has both hole-transporting properties and electron-transporting properties, holes and electrons are recombined more efficiently in the vicinity of the phosphorescent polymer compound, leading to higher light-emitting efficiency.

The hole-transporting polymerizable compounds and the electron-transporting polymerizable compounds are not particularly limited as long as they have substituent groups with polymerizable functional groups. Known charge-transporting compounds may be used. Examples of the known charge-transporting compounds include hole-transporting compounds such as triarylamine derivatives and carbazole derivatives, and electron-transporting compounds such as oxadiazole derivatives, triazole derivatives, imidazole derivatives, triazine derivatives and triarylborane derivatives.

The polymerizable functional groups may be radically polymerizable, cationically polymerizable, anionically polymerizable, addition polymerizable or condensation polymerizable functional groups. Of these, radically polymerizable functional groups are preferable because the polymer production is easy.

Examples of the polymerizable functional groups include alkenyl groups (such as vinyl group, isopropenyl group and allyl group), styryl group, acryloyloxy group, methacryloyloxy group, urethane(meth)acryloyloxy groups such as methacryloyloxyethyl carbamate group, vinylamide groups, and derivatives of these groups. Of these, the vinyl group, the styryl group and the methacryloyloxy group are preferred.

In detail, Formulae (A1) to (A12) below illustrate preferred examples of the substituent groups having an alkenyl group as the polymerizable functional group. Of these substituent groups, those of Formulae (A1), (A5), (A8) and (A12) are more preferred because the polymerizable functional groups can be easily introduced in the charge-transporting compounds.

[Chem. 17]

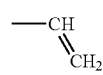

(A1)

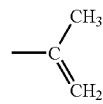

(A2)

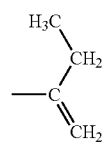

(A3)

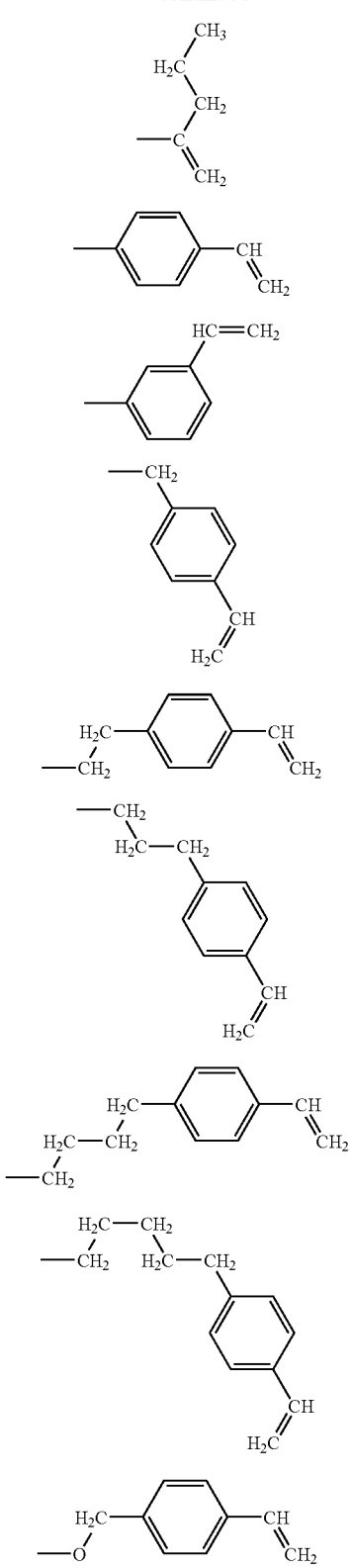
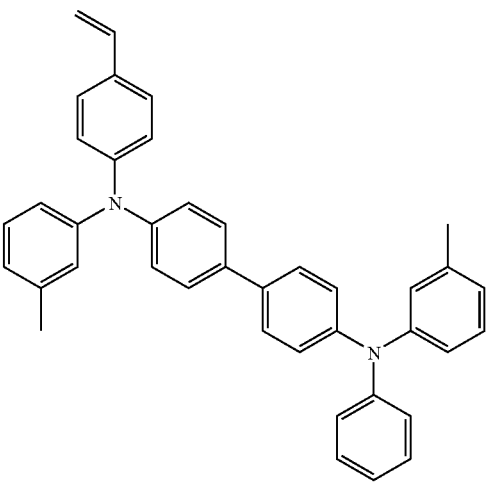
Formulae (E1) to (E6) below illustrate preferred examples of the hole-transporting polymerizable compounds. Of these, the compounds of Formulae (E1), (E2) and (E6) are more preferred from the viewpoint of electric charge mobility in the non-conjugated polymer compounds.

-continued

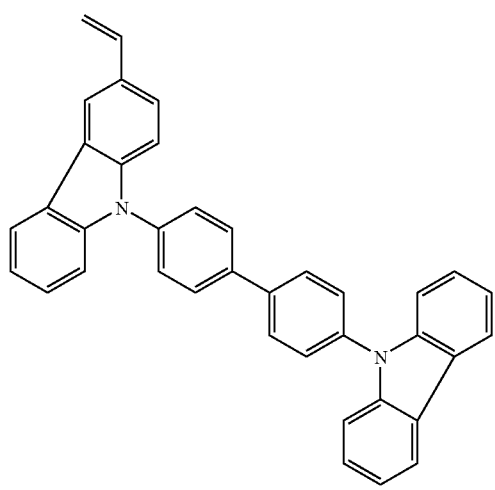
(E4)

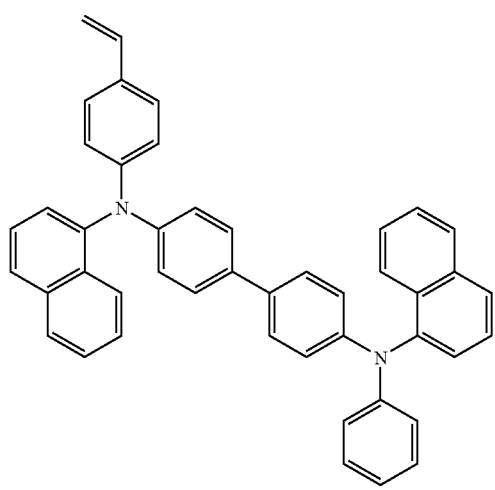
(E5)

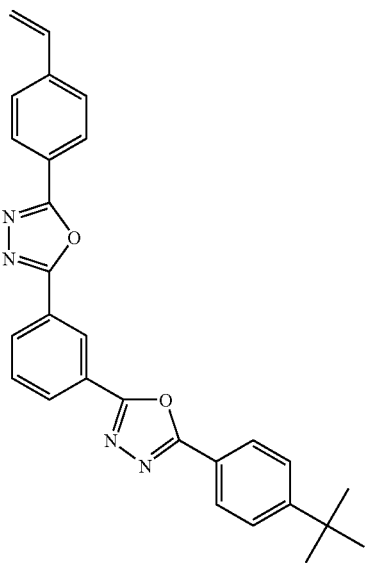
(E6)

The compounds represented by Formulae (E1) to (E6) may have a substituent group except hydrogen on the aromatic rings, such as halogen atoms, cyano group, C1-10 alkyl groups, C6-10 aryl groups, C1-10 alkoxy groups, and silyl groups optionally substituted with C1-10 alkyl groups.

Formulae (E7) to (E15) below illustrate preferred examples of the electron-transporting polymerizable compounds. Of these, the compounds of Formulae (E7) and (E12) to (E14) are more preferred from the viewpoint of electric charge mobility in the non-conjugated polymer compounds.

[Chem. 19]

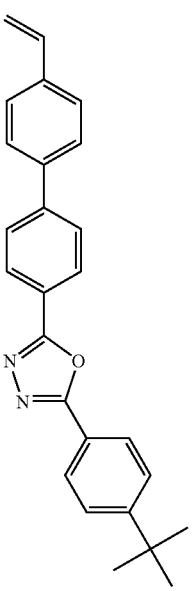
(E7)

(E8)

(E9)
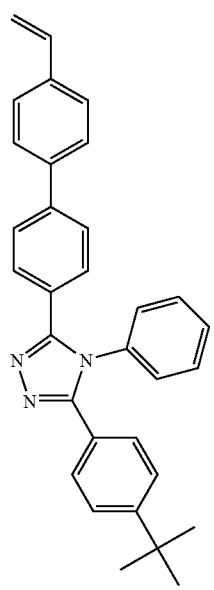
(E10)
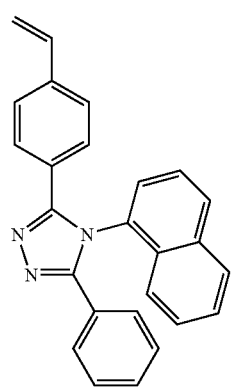
(E11)
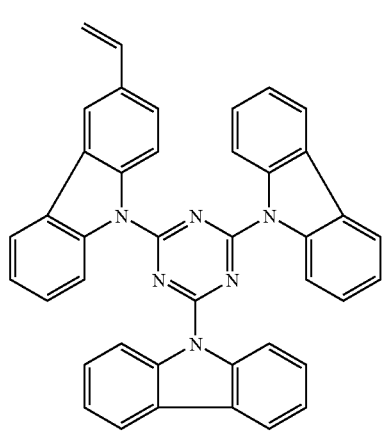
(E12)
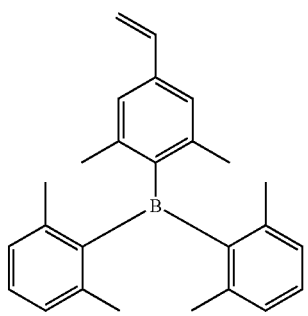
(E13)
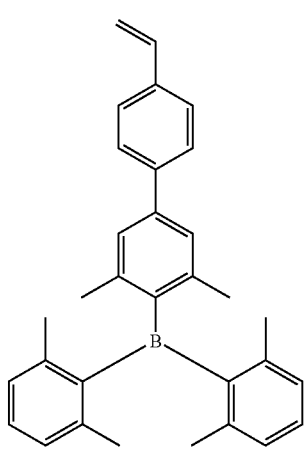
(E14)
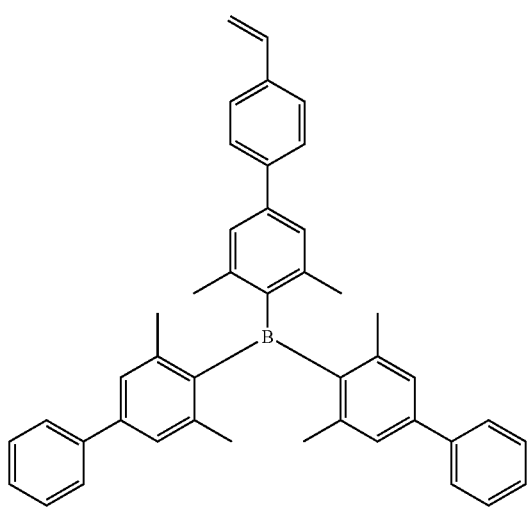

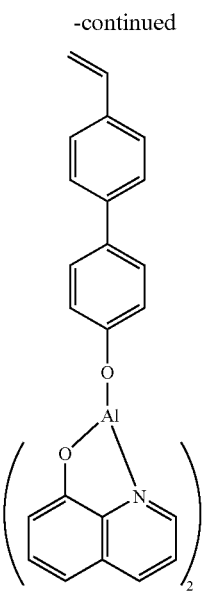

(E15)

The compounds represented by Formulae (E7) to (E15) may have a substituent group except hydrogen on the aromatic rings, such as halogen atoms, cyano group, C1-10 alkyl groups, C6-10 aryl groups, C1-10 alkoxy groups, and silyl groups optionally substituted with C1-10 alkyl groups.

In Formulae (E1) to (E15), the substituent group represented by Formula (A1) may be replaced by the substituent groups represented by Formulae (A2) to (A12). In particular, the compounds having the substituent groups represented by Formula (A1) or (A5) are preferable because the functional groups can be easily introduced in the polymerizable compounds.

Of the hole-transporting polymerizable compounds, those of Formulae (E1) to (E3) are more preferable. Of the electron-transporting polymerizable compounds, those of Formulae (E7) and (E12) to (E14) are more preferable. With these polymerizable compounds, holes and electrons recombine on the phosphorescent polymer compound more efficiently and higher luminance efficiency is achieved. The charge-transporting polymerizable compounds together with the phosphorescent compound can form an organic layer having a uniform composition. Organic EL devices including such organic layer show excellent durability.

<Phosphorescent Polymer Compounds>

The phosphorescent polymer compound may be an oligomer compound or a polymer compound. The phosphorescent polymer compound preferably has a weight average molecular weight of 1,000 to 5,000,000, more preferably 2,000 to 1,000,000, and still more preferably 3,000 to 100,000. As used herein, the molecular weight is measured by GPC (gel permeation chromatography) relative to polystyrene standards. When the molecular weight is in the above range, the polymer is soluble in organic solvents and gives uniform films.

The polymer compound may attain desired properties by appropriately controlling the amounts of the iridium complex and the charge-transporting polymerizable compound (hole-transporting polymerizable compound and/or electron-transporting polymerizable compound). The polymer compound may be a random copolymer, a block copolymer or an alternating copolymer.

Provided that the letter m represents the number of structural units derived from the iridium complex in the polymer compound, and the letter n represents the number of structural units derived from the charge-transporting compound (the total structural units derived from the hole-transporting polymerizable compound and/or the electron-transporting polymerizable compound) (m and n are integers of 1 or greater), the ratio of the iridium complex-derived structural units to the total structural units, namely, the ratio $m/(m+n)$, is preferably in the range of 0.001 to 0.5, and more preferably 0.001 to 0.2. When the ratio $m/(m+n)$ is within the above range, the electric charge mobility is high and the concentration quenching is small, in other words, organic EL devices show high light-emitting efficiency.

The polymer compound may include structural units derived from the hole-transporting compound and structural units derived from the electron-transporting compound. In this case, provided that the letter x represents the number of structural units from the hole-transporting compound, and the letter y represents the number of structural units from the electron-transporting compound (x and y are integers of 1 or greater), these letters and the above letter n have the following relation: $n=x+y$. An optimum ratio of the structural units from the hole-transporting compound to the total structural units derived from the charge-transporting compounds, namely, an optimum ratio $x/n$, and an optimum ratio of the structural units from the electron-transporting compound to the total structural units derived from the charge-transporting compounds, namely, an optimum ratio $y/n$, are dependent on the charge-transporting capacity of each of the structural units, and the charge-transporting capacity and concentration of the structural units from the iridium complex. In the case where an emitting layer of an organic EL device is formed of this polymer alone, the ratio $x/n$ and the ratio $y/n$ are each preferably 0.05 to 0.95, and more preferably 0.20 to 0.80, wherein $x/n+y/n=1$.

The phosphorescent polymer compounds of the invention may contain structural units derived from other polymerizable compounds while still achieving the objects of the invention. Examples of such polymerizable compounds include, but are not limited to, compounds without charge-transporting properties such as alkyl(meth)acrylates such as methyl acrylate and methyl methacrylate, styrene and derivatives thereof.

The polymer compounds are preferably produced by radical polymerization.

Preferred processes for producing the polymer compounds according to the invention include:

a process in which at least the compound of Formula (1) is polymerized in the presence of a radical polymerization initiator; and a process in which at least the compound of Formula (1) in an amount of m mol and the hole-transporting polymerizable compound in an amount of x mol and/or the electron-transporting polymerizable compound in an amount of y mol are polymerized in the presence of a radical polymerization initiator (wherein m, x and y are each an integer of 1 or greater;

the ratio $m/(m+x+y)$ is preferably in the range of 0.001 to 0.5, more preferably 0.001 to 0.2; and the ratio $x/(x+y)$ and the ratio $y/(x+y)$ are each preferably in the range of 0.05 to 0.95, more preferably 0.20 to 0.80).

Examples of the radical polymerization initiators include dimethyl-2,2'-azobis(2-methyl propionate).

(Organic EL Devices and Production Processes)

An embodiment of an organic EL device according to the present invention is shown in FIG. 1. However, the constitution of the organic EL devices of the invention is not limited thereto. In FIG. 1, an anode (2) is formed on a transparent substrate (1). Between the anode (2) and a cathode (6), a hole-transporting layer (3), an emitting layer (4) and an electron-transporting layer (5) are provided in this order. In another embodiment of the organic EL devices, 1) the hole-transporting layer and the emitting layer, or 2) the emitting layer and the electron-transporting layer may be provide between the anode (2) and the cathode (6). In a still another embodiment, 3) a layer including a hole-transporting material, an emitting material and an electron-transporting material, 4) a layer including a hole-transporting material and an emitting material, or 5) a layer including an emitting material and an electron-transporting material may be formed between the electrodes. In another embodiment, 6) one, two or more kinds of the emitting layers as described above may be provided.

An organic compound layer that contains the phosphorescent polymer compound having the phosphorescent sites and charge-transporting sites is an emitting layer having both hole-transporting properties and electron-transporting properties. Thus, organic EL devices of high luminance efficiency may be manufactured using the organic compound layer without providing other layers of organic compound materials.

<Substrates>

For use in the organic EL devices of the invention, insulating substrates that are transparent at wavelengths of light emitted from the emitting material are suitably used. Specific examples include glass, and transparent plastics such as PET (polyethyleneterephthalate) and polycarbonates.

<Processes for Producing Organic Compound Layers>

The organic compound layers may be produced by any methods without limitation. An exemplary method is given below. First, the phosphorescent polymer compound and charge-transporting polymerizable compound are dissolved in a solvent to give a solution. The solvents used herein are not particularly limited. Examples thereof include chlorine solvents such as chloroform, methylene chloride and dichloroethane; ether solvents such as tetrahydrofuran and anisole; aromatic hydrocarbon solvents such as toluene and xylene; ketone solvents such as acetone and methyl ethyl ketone; and ester solvents such as ethyl acetate, butyl acetate and ethyl cellosolve acetate. The solution is then spread on a base by inkjet printing, spin coating, dip coating or printing, thereby forming the organic compound layer. The concentration of the solution depends on the compounds used and film-forming conditions. For the spin coating or dip coating, the concentration is preferably 0.1 to 10 wt %. The organic layer may be formed easily as described above, and thereby the production steps are simplified and the increasing of device area is achieved.

(Other Materials)

The organic compound layers may contain polymer materials as binders. Examples of the polymer materials include polymethyl methacrylates, polycarbonates, polyesters, polysulfones and polyphenyleneoxides.

The organic compound layers may be formed of a material that is a mixture of materials with different functions, for example a mixture of emitting materials, hole-transporting materials and electron-transporting materials. The organic compound layer containing the phosphorescent polymer compound may contain another hole-transporting material and/or electron-transporting material to increase charge-transporting properties. Such charge-transporting materials may be low-molecular compounds or high-molecular compounds.

A hole-injection layer may be provided between the anode and the emitting layer to reduce the injection barrier and facilitate the hole injection. The hole-injection layer may be produced using known materials such as copper phthalocyanine, polyethylenedioxythiophene (PEDOT)/polystyrenesulfonic acid (PSS) mixture, oxides such as molybdenum oxide and silicon oxide, and fluorocarbons.

To improve the electron injection efficiency, an insulating layer 0.1 to 10 nm in thickness may be formed between the cathode and the electron-transporting layer or between the cathode and an organic compound layer adjacent to the cathode. The insulating layer may be formed using known materials such as lithium fluoride, sodium fluoride, magnesium fluoride, magnesium oxide and alumina.

Examples of the hole-transporting materials to form the hole-transporting layer or to be mixed in the emitting layer include TPD (N,N'-dimethyl-N,N'-(3-methylphenyl)-1,1'-biphenyl-4,4'-diamine); α-NPD (4,4'-bis[N-(1-naphthyl)-N-phenylamino]biphenyl); low-molecular triphenylamine derivatives such as m-MTDATA (4,4',4"-tris(3-methylphenylphenylamino)triphenylamine); polyvinylcarbazole; high-molecular compounds obtained by introducing polymerizable substituent groups in the above triphenylamine derivatives followed by polymerization; and phosphorescent polymer compounds such as polyparaphenylenevinylene and polydialkylfluorene. The high-molecular compounds include compounds with triphenylamine skeletons disclosed in JP-A-H08-157575. The hole-transporting materials may be used singly, or two or more kinds may be used in combination. Different hole-transporting materials may form respective layers that are laminated. The thickness of the hole-transporting layer is not particularly limited and is variable depending on the conductivity of the hole-transporting layer. The thickness is preferably in the range of 1 nm to 5 μm, more preferably 5 nm to 1 μm, and particularly preferably 10 nm to 500 nm.

Examples of the electron-transporting materials to form the electron-transporting layer or to be mixed in the emitting layer include low-molecular compounds such as quinolinol derivative metal complexes such as Alq3 (aluminum trisquinolinolate), oxadiazole derivatives, triazole derivatives, imidazole derivatives, triadine derivatives and triarylborane derivatives; and high-molecular compounds obtained by introducing polymerizable substituent groups to the above low-molecular compounds followed by polymerization. The high-molecular compounds include poly(PBD) disclosed in JP-A-H10-1665. The electron-transporting materials may be used singly, or two or more kinds may be used in combination. Different electron-transporting materials may form respective layers that are laminated. The thickness of the electron-transporting layer is not particularly limited and is variable depending on the conductivity of the electron-transporting layer. The thickness is preferably in the range of 1 nm to 5 μm, more preferably 5 nm to 1 μm, and particularly preferably 10 nm to 500 nm.

To inhibit holes from passing through the emitting layer and thereby to ensure efficient recombination of holes and electrons in the emitting layer, a hole-blocking layer may be provided adjacent to the emitting layer on the cathode side. The hole-blocking layer may be produced using known materials such as triazole derivatives, oxadiazole derivatives and phenanthroline derivatives.

The methods for producing the hole-transporting layers and the electron-transporting layers include dry film-forming methods such as resistance heating deposition, electron beam deposition and sputtering; and wet film-forming methods such as spin coating, casting, microgravure coating, gravure coating, bar coating, roll coating, wire bar coating, dip coating, spray coating, screen printing, flexographic printing, offset printing and inkjet printing. The dry film-forming methods are suitable for the low-molecular compounds, and the wet film-forming methods are suitable for the high-molecular compounds.

(Materials and Production of Anode and Cathode)

Examples of suitable anode materials for use in the organic EL devices of the invention include known transparent conductive materials such as ITO (indium tin oxide), tin oxide, zinc oxide and conductive polymers such as polythiophene, polypyrrole and polyaniline. The anode formed of the transparent conductive material preferably has a surface resistance of 1 to 50Ω/□ (ohms per square). The thickness of the anode is preferably 50 to 300 nm.

Examples of preferred cathode materials for use in the organic EL devices include known cathode materials such as alkali metals such as Li, Na, K and Cs; alkaline earth metals such as Mg, Ca and Ba; Al; MgAg alloy; and alloys of Al and alkali metals or alkaline earth metals such as AlLi and AlCa. The thickness of the cathode is preferably 10 nm to 1 μm, and more preferably 50 to 500 nm. When the cathode is formed using highly active metals such as alkali metals and alkaline earth metals, the thickness of the cathode is preferably 0.1 to 100 nm, and more preferably 0.5 to 50 nm. In this case, a metal layer that is stable in air is laminated on the cathode to protect the cathode metal. Examples of the protective metals include Al, Ag, Au, Pt, Cu, Ni and Cr. The thickness of the protective metal layer is preferably 10 nm to 1 μm, and more preferably 50 to 500 nm.

The methods for producing the anode include electron beam deposition, sputtering, chemical reactions and coating. The methods for forming the cathode include resistance heating deposition, electron beam deposition, sputtering and ion plating.

(Applications of Organic EL Devices)

The organic EL devices of the present invention are suitably used as pixels in display apparatuses of matrix system or segment system according to conventional techniques. The organic EL devices are also suitable as surface-emitting light sources without forming pixels.

The organic EL devices of the invention find applications in displays, backlights, electrophotographic systems, illuminating light sources, recording light sources, exposing sources, reading light sources, sings, advertising displays, interior accessories and optical communication systems.

EXAMPLES

The present invention will be described in detail by examples hereinbelow without limiting the scope of the invention.

Polymer compounds were analyzed by the following methods.

(1) Molecular Weight

The molecular weight was measured with a gel permeation chromatograph (GPC) under the following conditions.
Columns: Shodex KF-G, KF804L, KF802 and KF801
Eluting solution: tetrahydrofuran (THF)
Temperature: 40° C.
Detector: RI (Shodex RI-71)

(2) Composition Analysis $^1$H-NMR and $^{13}$C-NMR analyses were performed under the following conditions.
Apparatus: JNM EX270 manufactured by JEOL Ltd. 67.5 MHz
Solvent: deuterated chloroform (CDCl$_3$)
ICP elemental analysis was performed under the following conditions.

Apparatus: ICPS 8000 manufactured by Shimadzu Corporation

Mass spectrometry (ESI) was performed under the following conditions.
Spectrometer: LCQ Advantage manufactured by ThermoQuest Corp.
Flow solvent: acetonitrile (0.5 ml/min)

Devices manufactured were tested for external quantum efficiency, maximum brightness and luminance half life by the following methods.

(3) Maximum External Quantum Efficiency (%)

The organic EL device was placed in the dark. A spectroradiometer (CS-1000T manufactured by Konica Minolta Holdings, Inc.) was located 100 cm away from the emitting surface in a perpendicular direction. A predetermined voltage was applied to the organic EL device for 1 second to cause the device to emit light. The current passing through the device, the front brightness observed on the anode side of the device, and an emission spectrum were measured at a viewing angle of 0.2 degree. The voltage was increased stepwise by 0.1 V starting from 0 V. The current, brightness and emission spectrum were measured immediately after the voltage was increased. The external quantum efficiency was calculated from the data obtained, and the maximum external quantum efficiency was determined as the external quantum efficiency of the device.

(4) Maximum Brightness (cd/m$^2$)

The front brightness of the organic EL device was measured in the same manner as the measurement of the maximum external quantum efficiency, except that the voltage was increased stepwise by 0.5 V. The maximum value was determined as the maximum brightness of the device.

(5) Luminance Half Life (h)

Under similar conditions as described in the measurement of the maximum external quantum efficiency, the organic EL device was energized to a brightness of 100 cd/m$^2$ while measuring the front brightness. A silicon photodiode was attached to the device on the anode side. While the current was maintained constant, the photocurrent through the photodiode was measured. The time required until the photocurrent was reduced by half was determined as the luminance half life.

Synthetic Example 1

Synthesis of Ligand (L$^1$-H) and Ligand (L$^2$-H)

Synthetic Example 1-1

Synthesis of Compound (a2-1-H)

[Chem. 20]

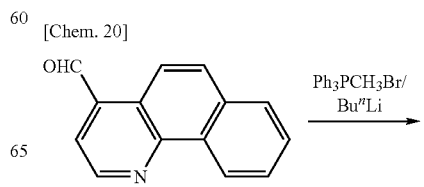

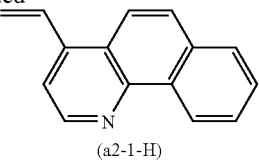

(a2-1-H)

Methyltriphenylphosphonium bromide in an amount of 4.6 g (13 mmol) was suspended in 25 ml of tetrahydrofuran. To the suspension, 8.1 ml (13 mmol) of a 1.6 M hexane solution of n-butyllithium was added dropwise at 0° C. The mixture was stirred at the temperature for 1 hour, and 15 ml of a tetrahydrofuran solution containing 2.6 g (13 mmol) of 4-formylbenzo[h]quinoline (synthesized according to a method described in Journal of the American Chemical Society, 1945, vol. 67, p. 511) was added thereto dropwise, followed by stirring at room temperature for 3 hours. From the resultant reaction liquid, the solvent was distilled away at reduced pressure and the residue was purified by silica gel column chromatography (eluting solution: chloroform) to give a compound (a2-1-H) in an amount of 2.3 g (11 mmol) (yield: 85%).

Synthetic Example 1-2

Synthesis of Compound (a3-1-H)

[Chem. 21]

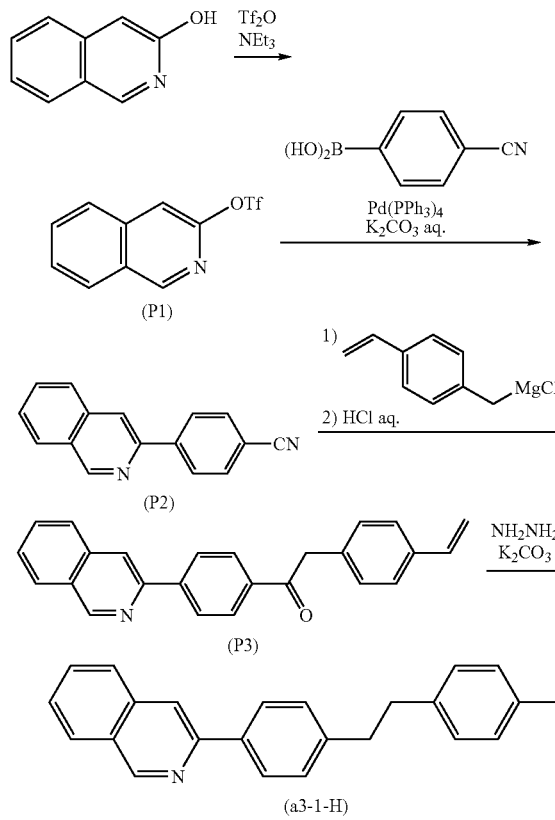

3-Hydroxyisoquinoline in an amount of 5.0 g (34 mmol) was dissolved in 40 ml of dichloromethane. The solution was cooled in an ice bath, and 4.0 g (40 mmol) of triethylamine and 10.2 g (36 mmol) of trifluoromethanesulfonic anhydride were sequentially added dropwise to the solution. The mixture was stirred at room temperature for 6 hours. The reaction liquid was washed with water and a 1N aqueous hydrochloric acid solution. The solvent was distilled away under reduced pressure, and a crude product of a compound (P1) was obtained.

To the compound (P1), 5.0 g (34 mmol) of 4-cyanophenylboronic acid, 1.0 g (0.87 mmol) of tetrakis(triphenylphosphine)palladium, 100 ml of 1,2-dimethoxyethane and 100 ml of an aqueous solution containing 27.0 g (195 mmol) of potassium carbonate were added. The mixture was heated under reflux for 4 hours. The resultant reaction mixture was cooled to room temperature, and the organic layer was extracted with ethyl acetate. The extract was distilled under reduced pressure to remove the solvent and was dissolved in a 1:1 mixture liquid of dichloromethane and ethyl acetate. The solution was passed through a short silica gel column to give a crude product of a compound (P2).

The compound (P2) was dissolved in 30 ml of tetrahydrofuran, and a 1.0 M diethyl ether solution of 4-vinylbenzylmagnesium chloride was added dropwise to the solution, followed by stirring at room temperature for 4 hours. To the reaction liquid thus obtained, a 1N aqueous hydrochloric acid solution was added. The organic layer was washed with water, and the solvent was distilled away under reduced pressure, resulting in a crude product of a compound (P3).

The compound (P3) was combined with 45 g (330 mmol) of potassium carbonate, 500 ml of diethylene glycol and 15 g (300 mmol) of hydrazine monohydrate. The mixture was stirred at 120° C. for 2.5 hours. The temperature was then increased to 200° C. to perform distillation, and the residue was cooled to room temperature. Water was added to the reaction mixture, and the resultant precipitate was washed with water, dried under reduced pressure and purified by silica gel column chromatography (eluting solution: chloroform) to give 2.9 g (8.6 mmol) of a compound (a3-1-H) (yield: 27%).

Synthetic Example 1-3

Synthesis of Compound (a5-1-H)

[Chem. 22]

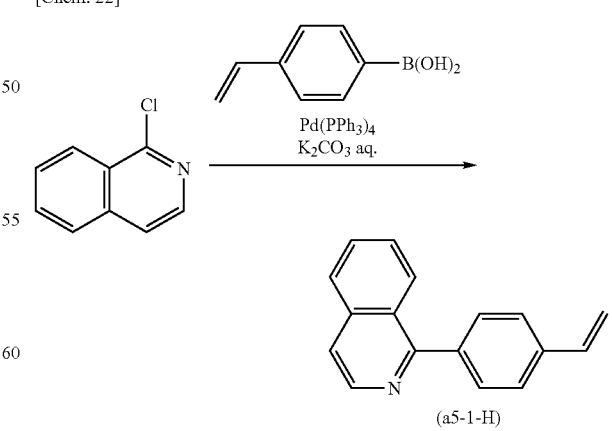

(a5-1-H)

100 ml of an aqueous solution containing 27.0 g (195 mmol) of potassium carbonate was added to a mixture consisting of 10.2 g (62 mmol) of 1-chloroisoquinoline, 9.2 g (62 mmol) of 4-vinylphenylboronic acid, 1.0 g (0.87 mmol) of tetrakis(triphenylphosphine)palladium and 100 ml of 1,2-dimethoxyethane. The mixture was heated under reflux for 2.5 hours. The resultant reaction mixture was cooled to room temperature, and the organic layer was extracted with ethyl acetate. The extract was distilled under reduced pressure to remove the solvent and was purified by silica gel column chromatography (eluting solution: 10/1 mixture of chloroform/ethyl acetate) to give 8.1 g (35 mmol) of a compound (a5-1-H) (yield: 56%).

Synthetic Example 1-4

Synthesis of Compound (a4-1-H)

A compound (a4-1-H) was synthesized by the same procedures as for the compound (a5-1-H), except that 1-chloroisoquinoline was replaced by 2-chloroquinoline.

[Chem. 23]

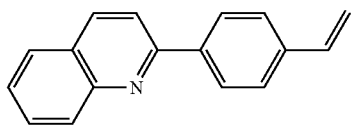

(a4-1-H)

Synthetic Example 1-5

Synthesis of Compound (a7-1-H)

[Chem. 24]

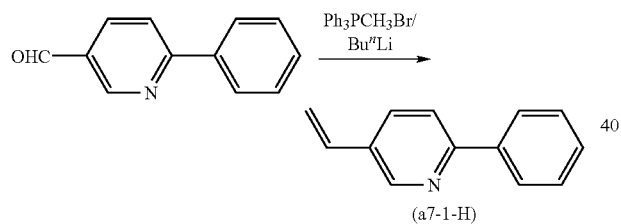

(a7-1-H)

Methyltriphenylphosphonium bromide in an amount of 7.0 g (20 mmol) was suspended in 50 ml of tetrahydrofuran. To the suspension, 12.3 ml (20 mmol) of a 1.6 M hexane solution of n-butyllithium was added dropwise at 0° C. The mixture was stirred at the temperature for 1 hour, and 25 ml of a tetrahydrofuran solution containing 3.7 g (20 mmol) of 5-formyl-2-phenylpyridine (synthesized in the same manner as the compound (a5-1-H) except that 1-chloroisoquinoline was replaced by 2-chloro-5-formylpyridine and 4-vinylphenylboronic acid was replaced by phenylboronic acid) was added thereto dropwise, followed by stirring at room temperature for 3 hours. From the resultant reaction liquid, the solvent was distilled away at reduced pressure and the residue was purified by silica gel column chromatography (eluting solution: chloroform) to give a compound (a7-1-H) in an amount of 3.3 g (18 mmol) (yield: 90%).

Synthetic Example 1-6

Synthesis of Compound (b1-1-H)

A compound (b1-1-H) was synthesized by the same procedures as for the compound (a5-1-H), except that 1-chloroisoquinoline was replaced by 2-bromo-4-picoline and 4-vinylphenylboronic acid was replaced by phenylboronic acid.

[Chem. 25]

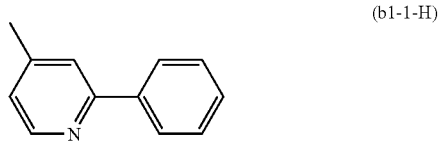

(b1-1-H)

Compounds (a4-2-H) and (b3-1-H) were synthesized according to methods described in JP-A-2007-23269 and Journal of the American Chemical Society, 1945, vol. 67, p. 511, respectively.

[Chem. 26]

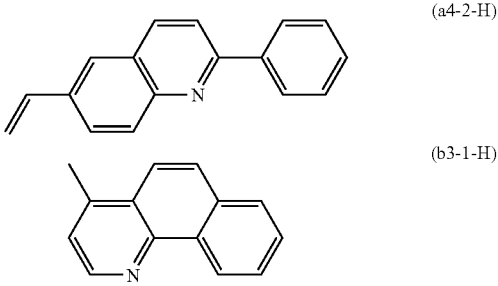

(a4-2-H)

(b3-1-H)

Synthetic Example 2

Synthesis of Compound (α)

Synthetic Example 2-1

Synthesis of Compound (α-1)

[Chem. 27]

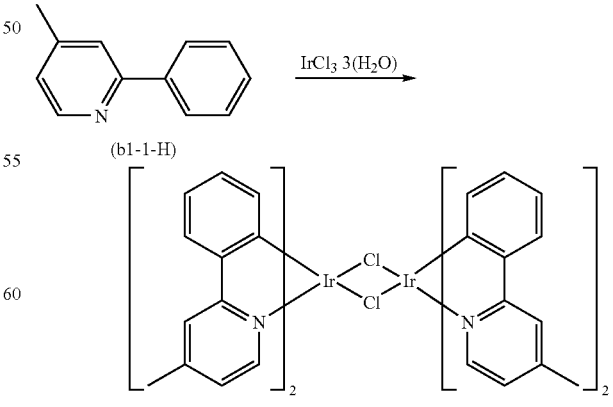

(α-1)

A mixture containing 2.5 g (15 mmol) of the compound (b1-1-H), 2.5 g (7.1 mmol) of iridium chloride trihydrate, 30 ml of 2-ethoxyethanol and 10 ml of water was heated under reflux for 12 hours. A small amount of water was added to the reaction liquid, and the resultant precipitate was filtered, washed with methanol and dried under reduced pressure to give 3.0 g (2.7 mmol) of a compound (α-1) (yield: 76%).

Synthetic Example 2-2

Synthesis of Compound (α-2)

A compound (α-2) was synthesized by the same procedures as for the compound (α-1), except that the compound (b1-1-H) was replaced by dibenzo[f,h]quinoline.

[Chem. 28]

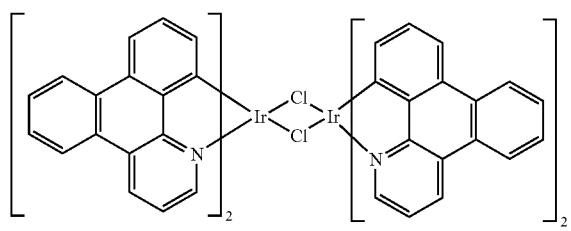

(α-2)

Synthetic Example 2-3

Synthesis of Compound (α-3)

A compound (α-3) was synthesized by the same procedures as for the compound (α-1), except that the compound (b1-1-H) was replaced by the compound (b3-1-H).

[Chem. 29]

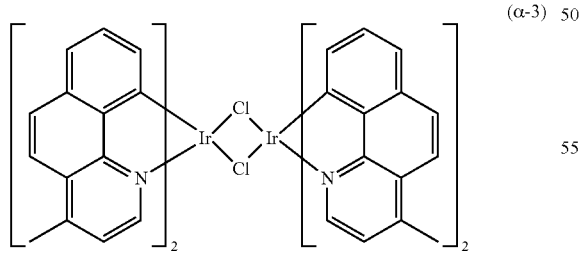

(α-3)

Compounds (α-4) and (α-5) were synthesized according to a method described in JP-A-2006-8996, and a compound (α-6) was synthesized by a method described in Bulletin of the Chemical Society of Japan, 1974, vol. 47, p. 767.

[Chem. 30]

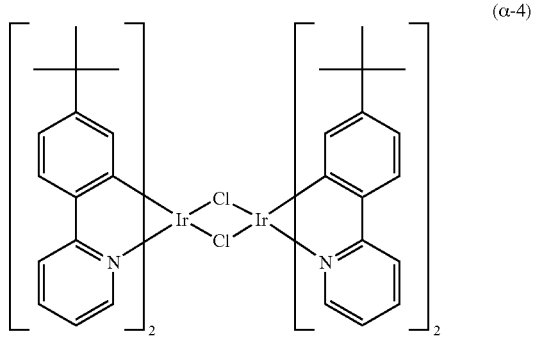

(α-4)

(α-5)

(α-6)

Synthetic Example 3

Synthesis of Polymerizable Iridium Complex

The compounds (α) were reacted with the compound (L¹-H) in the presence of silver trifluoromethanesulfonate to give polymerizable iridium complexes (1-1), (1-2), (2-1), (2-2), (3-1), (4-1), (4-2) and (4-3). As an example, the synthesis of the polymerizable iridium complex (1-1) is described below.

A mixture containing 2.9 g (2.6 mmol) of the compound (α-1), 1.5 g (7.3 mmol) of the compound (a2-1-H), 1.3 g (5.2 mmol) of silver trifluoromethanesulfonate and 150 ml of toluene was heated under reflux for 3 hours. The reaction liquid obtained was filtered through Celite. The filtrate was distilled under reduced pressure to remove the solvent and was purified by silica gel column chromatography (eluting solution: toluene) to give a polymerizable iridium complex (1-1) in an amount of 0.50 g (0.68 mmol) (yield: 13%).

[Chem. 31]
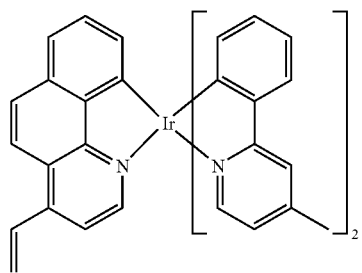 (1-1)
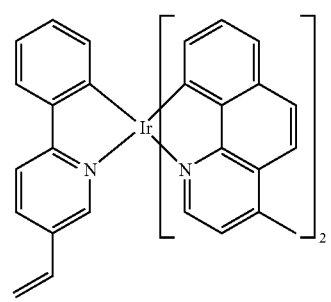 (1-2)
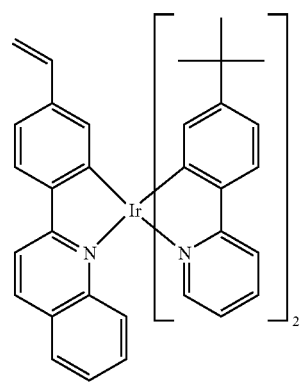 (2-1)
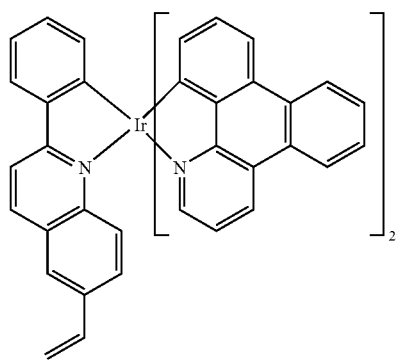 (2-2)
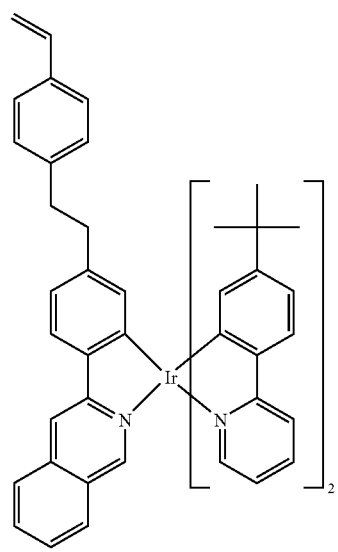 (3-1)
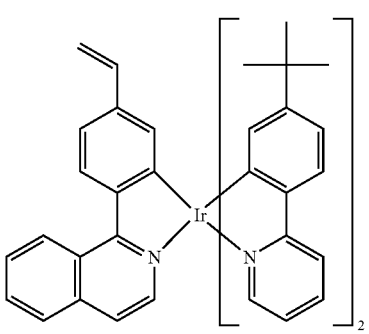 (4-1)
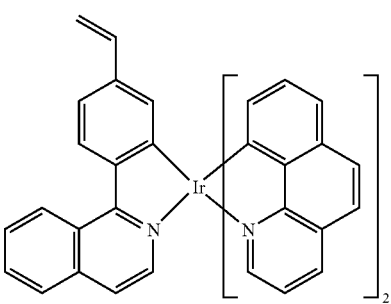 (4-2)
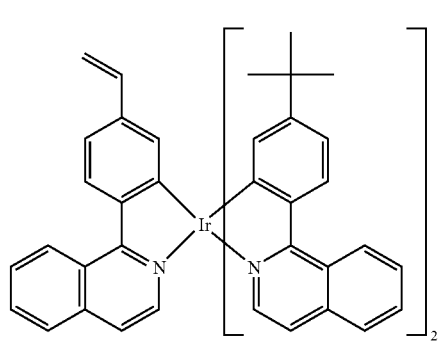 (4-3)

The identification data of the polymerizable iridium complexes are shown in Table 1.

TABLE 1

| Polymerizable iridium complex | Elemental analysis | | | | | | Mass spectrometry (ESI+) |
|---|---|---|---|---|---|---|---|
| | Calculated values | | | Measured values | | | |
| | C | H | N | C | H | N | |
| 1-1 | 63.91 | 4.13 | 5.73 | 64.17 | 4.06 | 5.77 | 733 (M+) |
| 1-2 | 65.06 | 3.99 | 5.55 | 65.50 | 4.08 | 5.26 | 757 (M+) |
| 2-1 | 66.96 | 5.26 | 4.98 | 67.11 | 5.09 | 4.79 | 843 (M+) |
| 2-2 | 69.68 | 3.67 | 4.78 | 69.82 | 3.61 | 4.66 | 879 (M+) |
| 3-1 | 69.74 | 5.53 | 4.44 | 69.54 | 5.39 | 4.13 | 947 (M+) |
| 4-1 | 66.96 | 5.26 | 4.98 | 66.75 | 5.18 | 4.76 | 843 (M+) |
| 4-2 | 66.30 | 3.62 | 5.39 | 66.46 | 3.47 | 5.25 | 779 (M+) |
| 4-3 | 70.04 | 5.13 | 4.46 | 69.90 | 5.17 | 4.68 | 943 (M+) |

Polymerizable iridium complexes (2-3) and (2-4) were synthesized according to a method described in JP-A-2007-23269, and a polymerizable iridium complex (3-2) was synthesized by a method according to JP-A-2006-8996.

[Chem. 32]

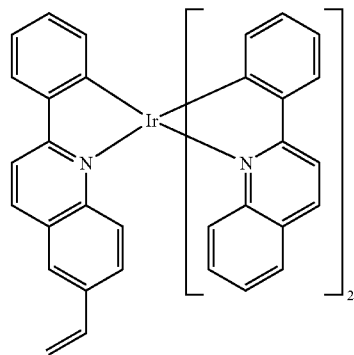

(2-3)

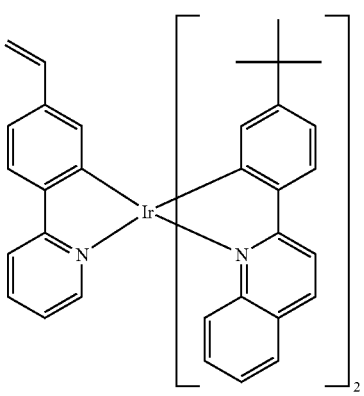

(2-4)

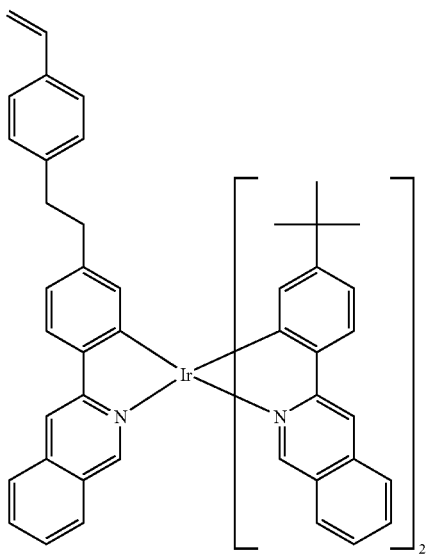

(3-2)

Example 1

Synthesis of Polymer Compound (1-1)

A closed container was charged with 80 mg of the iridium complex (1-1), 460 mg of the polymerizable compound (E1) and 460 mg of the polymerizable compound (E7). Dehydrated toluene (5.0 mL) was added to the container. Subsequently, a toluene solution of 2,2'-azobis(isobutyronitrile) (0.1 M, 0.10 mL) was added, and freezing and degassing were repeated five times. The container was tightly closed in vacuum, and the materials were stirred at 60° C. for 60 hours. After the reaction, the reaction liquid was dropped to 200 mL of acetone. The resultant precipitate was purified by two cycles of reprecipitation from toluene to acetone, and was dried at 50° C. in vacuum overnight to give a polymer compound (1-1). The polymer compound (1-1) had a weight average molecular weight (Mw) of 42500 and a molecular weight distribution (Mw/Mn) of 2.62. From the results of ICP elemental analysis and $^{13}$C-NMR, the m/(m+n) ratio of the polymer compound was estimated to be 0.049. In the polymer compound (1a), x/n was 0.46 and y/n was 0.54.

Examples 2-6 and Comparative Examples 1-5

Synthesis of Polymer Compounds (2-1), (2-2), (3-1), (4-1) and (4-2), and Comparative Polymer Compounds (1-2), (2-3), (2-4), (3-2) and (4-3)

Polymer compounds (2-1), (2-2), (3-1), (4-1) and (4-2), and comparative polymer compounds (1-2), (2-3), (2-4), (3-2) and (4-3) were synthesized in the same manner as in Example 1-1, except that the iridium complexes and polymerizable compounds as shown in Table 2 were used.

TABLE 2

| | Polymer compound | Polymer composition | Mw | Mw/Mn | m/(m + n) | x/n | y/n |
|---|---|---|---|---|---|---|---|
| Ex. 1 | 1-1 | Iridium complex (1-1) 80 mg<br>Polymerizable compound (E1) 460 mg<br>Polymerizable compound (E7) 460 mg | 42500 | 2.62 | 0.049 | 0.46 | 0.54 |
| Ex. 2 | 2-1 | Iridium complex (2-1) 80 mg<br>Polymerizable compound (E1) 460 mg<br>Polymerizable compound (E7) 460 mg | 43100 | 2.56 | 0.055 | 0.45 | 0.55 |
| Ex. 3 | 2-2 | Iridium complex (2-2) 80 mg<br>Polymerizable compound (E1) 460 mg<br>Polymerizable compound (E7) 460 mg | 42700 | 2.29 | 0.050 | 0.44 | 0.56 |
| Ex. 4 | 3-1 | Iridium complex (3-1) 80 mg<br>Polymerizable compound (E6) 460 mg<br>Polymerizable compound (E14) 460 mg | 88000 | 3.11 | 0.061 | 0.51 | 0.49 |
| Ex. 5 | 4-1 | Iridium complex (4-1) 80 mg<br>Polymerizable compound (E3) 460 mg<br>Polymerizable compound (E14) 460 mg | 41900 | 2.17 | 0.048 | 0.54 | 0.46 |
| Ex. 6 | 4-2 | Iridium complex (4-2) 80 mg<br>Polymerizable compound (E2) 460 mg<br>Polymerizable compound (E14) 460 mg | 40800 | 2.25 | 0.050 | 0.52 | 0.48 |
| Comp. Ex. 1 | 1-2 | Iridium complex (1-2) 80 mg<br>Polymerizable compound (E1) 460 mg<br>Polymerizable compound (E7) 460 mg | 42800 | 2.67 | 0.048 | 0.45 | 0.55 |
| Comp. Ex. 2 | 2-3 | Iridium complex (2-3) 80 mg<br>Polymerizable compound (E1) 460 mg<br>Polymerizable compound (E7) 460 mg | 44500 | 2.42 | 0.049 | 0.47 | 0.53 |
| Comp. Ex. 3 | 2-4 | Iridium complex (2-4) 80 mg<br>Polymerizable compound (E1) 460 mg<br>Polymerizable compound (E7) 460 mg | 48500 | 2.10 | 0.048 | 0.46 | 0.54 |
| Comp. Ex. 4 | 3-2 | Iridium complex (3-2) 80 mg<br>Polymerizable compound (E6) 460 mg<br>Polymerizable compound (E14) 460 mg | 101200 | 3.24 | 0.060 | 0.50 | 0.50 |
| Comp. Ex. 5 | 4-3 | Iridium complex (4-3) 80 mg<br>Polymerizable compound (E2) 460 mg<br>Polymerizable compound (E14) 460 mg | 43700 | 2.62 | 0.051 | 0.51 | 0.49 |

Production and Evaluation of Organic EL Devices

Example 7

An ITO glass substrate (a product of NIPPO ELECTRIC CO., LTD.) was used. The glass substrate was a 25 mm square, and two stripe electrodes (anodes) of ITO (indium tin oxide) were formed with a width of 4 mm on one surface of the substrate.

The ITO glass substrate was spin coated with poly(3,4-ethylenedioxythiophene)polystyrenesulfonic acid (Baytron P manufactured by Bayer AG) at 3500 rpm. for 40 seconds. The coated substrate was dried in a vacuum dryer at reduced pressure and 60° C. for 2 hours, and an anode buffer layer having a thickness of about 50 nm was formed. Subsequently, 90 mg of the polymer compound (1-1) was dissolved in 2910 mg of toluene (special grade, manufactured by Wako Pure Chemical Industries, Ltd.). The solution was filtered through a 0.2 μm pore filter and the filtrate was obtained as a coating solution. The coating solution was spread over the anode buffer layer by spin coating at 3000 rpm for 30 seconds. The coating was dried at room temperature (25° C.) for 30 minutes to form an emitting layer, which was approximately 100 nm in thickness.

The substrate with the emitting layer was placed in a deposition apparatus. Barium and aluminum were codeposited in a weight ratio of 1:10 such that two stripe cathodes were formed with a width of 3 mm and in a direction perpendicular to the anode-extending direction. The cathodes were approximately 50 nm thick.

Thereafter, leads (wires) were attached to the anodes and cathodes in an argon atmosphere. Thus, four organic EL devices 4 mm in length and 3 mm in width were manufactured. The organic EL devices were energized using a programmable direct voltage/current source (TR6143 manufactured by ADVANTEST CORPORATION) to emit light.

Table 3 sets forth the maximum external quantum efficiency, the maximum brightness and the luminance half life from 100 cd/m² initial brightness at a constant current.

Example 8

Organic EL devices were manufactured in the same manner as in Example 7, except that the coating solution for the emitting layer was prepared from 90 mg of the polymer compound (2-1) and 2910 mg of toluene. Table 3 sets forth the maximum external quantum efficiency, the maximum brightness and the luminance half life from 100 cd/m² initial brightness at a constant current.

Example 9

Organic EL devices were manufactured in the same manner as in Example 7, except that the coating solution for the emitting layer was prepared from 90 mg of the polymer compound (2-2) and 2910 mg of toluene. Table 3 sets forth the maximum external quantum efficiency, the maximum brightness and the luminance half life from 100 cd/m² initial brightness at a constant current.

Example 10

Organic EL devices were manufactured in the same manner as in Example 7, except that the coating solution for the emitting layer was prepared from 90 mg of the polymer compound (3-1) and 2910 mg of toluene. Table 3 sets forth the maximum external quantum efficiency, the maximum brightness and the luminance half life from 100 cd/m² initial brightness at a constant current.

Example 11

Organic EL devices were manufactured in the same manner as in Example 7, except that the coating solution for the emitting layer was prepared from 90 mg of the polymer compound (4-1) and 2910 mg of toluene. Table 3 sets forth the maximum external quantum efficiency, the maximum brightness and the luminance half life from 100 cd/m² initial brightness at a constant current.

Example 12

Organic EL devices were manufactured in the same manner as in Example 7, except that the coating solution for the emitting layer was prepared from 90 mg of the polymer compound (4-2) and 2910 mg of toluene. Table 3 sets forth the maximum external quantum efficiency, the maximum brightness and the luminance half life from 100 cd/m² initial brightness at a constant current.

Comparative Example 6

Organic EL devices were manufactured in the same manner as in Example 7, except that the coating solution for the emitting layer was prepared from 90 mg of the polymer compound (1-2) and 2910 mg of toluene. Table 3 sets forth the maximum external quantum efficiency, the maximum brightness and the luminance half life from 100 cd/m² initial brightness at a constant current.

Comparative Example 7

Organic EL devices were manufactured in the same manner as in Example 7, except that the coating solution for the emitting layer was prepared from 90 mg of the polymer compound (2-3) and 2910 mg of toluene. Table 3 sets forth the maximum external quantum efficiency, the maximum brightness and the luminance half life from 100 cd/m² initial brightness at a constant current.

Comparative Example 8

Organic EL devices were manufactured in the same manner as in Example 7, except that the coating solution for the emitting layer was prepared from 90 mg of the polymer compound (2-4) and 2910 mg of toluene. Table 3 sets forth the maximum external quantum efficiency, the maximum brightness and the luminance half life from 100 cd/m² initial brightness at a constant current.

Comparative Example 9

Organic EL devices were manufactured in the same manner as in Example 7, except that the coating solution for the emitting layer was prepared from 90 mg of the polymer compound (3-2) and 2910 mg of toluene. Table 3 sets forth the maximum external quantum efficiency, the maximum brightness and the luminance half life from 100 cd/m² initial brightness at a constant current.

Comparative Example 10

Organic EL devices were manufactured in the same manner as in Example 7, except that the coating solution for the emitting layer was prepared from 90 mg of the polymer compound (4-3) and 2910 mg of toluene. Table 3 sets forth the maximum external quantum efficiency, the maximum brightness and the luminance half life from 100 cd/m² initial brightness at a constant current.

TABLE 3

| | Maximum external quantum efficiency (%) | Maximum brightness (cd/m²) | Luminance half life (h) |
|---|---|---|---|
| Ex. 7 | 7.0 | 45500 | 7000 |
| Ex. 8 | 7.2 | 36200 | 7500 |
| Ex. 9 | 6.9 | 31700 | 6900 |
| Ex. 10 | 6.8 | 33000 | 7300 |
| Ex. 11 | 7.0 | 19800 | 6400 |
| Ex. 12 | 7.1 | 23000 | 6600 |
| Comp. Ex. 6 | 6.8 | 44500 | 3200 |
| Comp. Ex. 7 | 7.1 | 32900 | 3900 |
| Comp. Ex. 8 | 6.6 | 32000 | 3700 |
| Comp. Ex. 9 | 6.8 | 31500 | 4400 |
| Comp. Ex. 10 | 6.9 | 17600 | 3700 |

INDUSTRIAL APPLICABILITY

The organic EL devices of the invention are suitably used in displays, backlights, electrophotographic systems, illuminating light sources, recording light sources, exposing sources, reading light sources, sings, advertising displays, interior accessories and optical communication systems.

The invention claimed is:

1. A phosphorescent polymer compound comprising a structural unit that is obtained by radical polymerization of a compound of Formula (1):

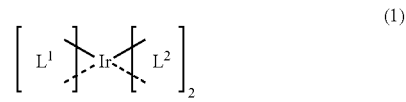

wherein $L^1$ is a ligand selected from Formulae (a2) to (a5) below and $L^2$ is a ligand selected from Formulae (b1) to (b3) below:

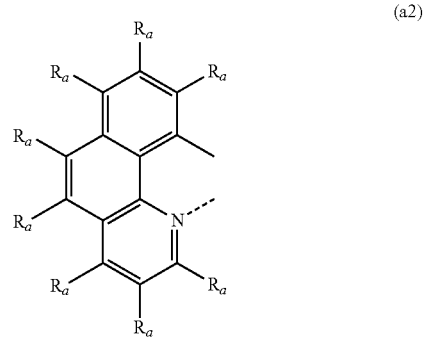

(a3)
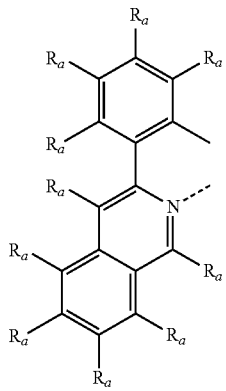

(a4)
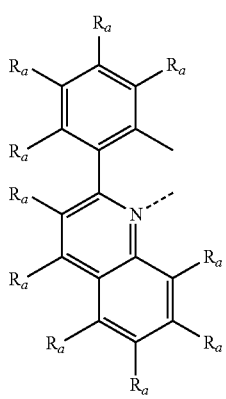

(a5)
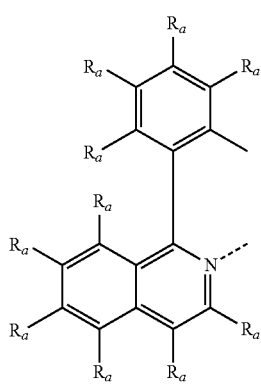

wherein a plurality of $R_a$ in each of Formulae (a2) to (a5) are each independently a hydrogen atom, a C1-10 alkyl group or a C1-5 alkyl or alkenyl group having a polymerizable functional group; and only one of the plurality of $R_a$ in each of Formulae (a2) to (a5) is a C1-5 alkyl or alkenyl group having a polymerizable functional group;

(b1)
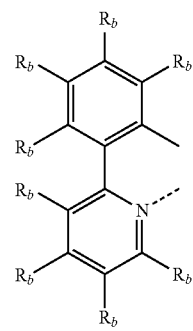

(b2)
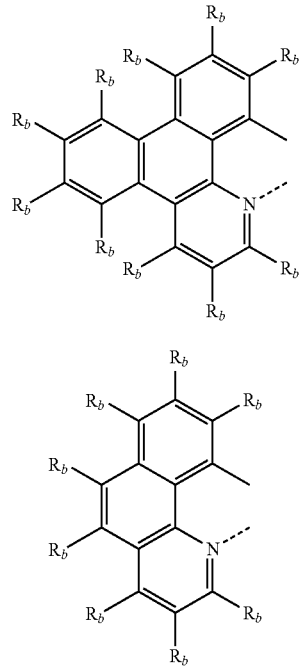

(b3)
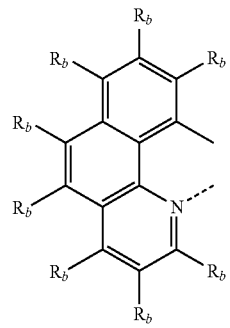

wherein a plurality of $R_b$ in each of Formulae (b1) to (b3) are each independently a hydrogen atom or a C1-10 alkyl group;

and wherein $L^1$ and $L^2$ are selected such that $E^1$ and $E^2$ described below satisfy the relation $E^1 < E^2$;

$E^1$ is a frequency (cm$^{-1}$) of light showing a maximum luminescence intensity in a luminescence spectrum obtained by exciting a solution of an iridium complex of Formula (2) below [in dichloromethane at 25° C., the solution being prepared such that the absorbance for 350 nm monochromatic light with a light path length of 1 cm is 0.1] with 350 nm monochromic light:

(2)
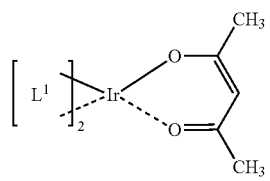

wherein $L^1$ is a ligand selected from Formulae (a2) to (a5) as $L^1$ is defined in Formula (1), in which $R_a$ are all hydrogen atoms;

$E^2$ is a frequency (cm$^{-1}$) of light showing a maximum luminescence intensity in a luminescence spectrum obtained by exciting a solution of an iridium complex of Formula (3) below [in dichloromethane at 25° C., the solution being prepared such that the absorbance for 350 nm monochromatic light with a light path length of 1 cm is 0.1] with 350 nm monochromic light:

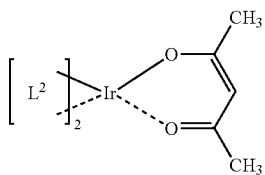
(3)

wherein $L^2$ is a ligand selected from Formulae (b1) to (b3) as $L^2$ is defined in Formula (1), in which $R_b$ are all hydrogen atoms.

2. The phosphorescent polymer compound according to claim 1, wherein the main chain skeleton of the polymer compound is a saturated carbon chain skeleton.

3. The phosphorescent polymer compound according to claim 1, wherein the difference between $E_1$ and $E_2$ is not less than 1000 cm$^{-1}$.

4. The phosphorescent polymer compound according to claim 1, wherein the phosphorescent polymer compound further comprises a structural unit derived from at least one of hole-transporting polymerizable compounds and electron-transporting polymerizable compounds.

5. A process for manufacturing organic electroluminescence devices, comprising a step of forming on an anode at least one organic compound layer comprising the phosphorescent polymer compound described in claim 1, and a step of forming a cathode on the organic compound layer.

6. An organic electroluminescence device manufactured by the process described in claim 5.

7. An organic electroluminescence device wherein the device comprises a pair of electrodes and at least one organic compound layer including a light-emitting layer between the electrodes, and the light-emitting layer comprises the phosphorescent polymer compound described in claim 1.

8. A display device comprising the organic electroluminescence device described in claim 7.

* * * * *